US006940117B2

(12) United States Patent
Coolbaugh et al.

(10) Patent No.: US 6,940,117 B2
(45) Date of Patent: Sep. 6, 2005

(54) PREVENTION OF $TA_2O_5$ MIM CAP SHORTING IN THE BEOL ANNEAL CYCLES

(75) Inventors: Douglas D. Coolbaugh, Essex Junction, VT (US); Ebenezer E. Eshun, Essex Junction, VT (US); Joseph F. Shepard, Jr., Fishkill, NY (US); Kenneth J. Stein, Sandy Hook, CT (US); Kunal Vaed, Poughkeepsie, NY (US)

(73) Assignee: International Business Machines Corporation, Armonk, NY (US)

(*) Notice: Subject to any disclaimer, the term of this patent is extended or adjusted under 35 U.S.C. 154(b) by 1 day.

(21) Appl. No.: 10/249,550

(22) Filed: Apr. 17, 2003

(65) Prior Publication Data

US 2004/0104420 A1 Jun. 3, 2004

Related U.S. Application Data

(60) Provisional application No. 60/430,421, filed on Dec. 3, 2002.

(51) Int. Cl.[7] ........................ H01L 27/108; H01L 29/76; H01L 29/94; H01L 31/119

(52) U.S. Cl. ........................ 257/310; 257/315; 438/253

(58) Field of Search ................................ 257/296, 303, 257/307, 310, 315; 438/253, 396, 591, 710, 769

(56) References Cited

U.S. PATENT DOCUMENTS

| | | | | | |
|---|---|---|---|---|---|
| 6,201,276 | B1 | * | 3/2001 | Agarwal et al. | 257/315 |
| 6,271,084 | B1 | | 8/2001 | Tu et al. | 438/253 |
| 6,344,964 | B1 | | 2/2002 | Adler | 361/306.3 |
| 6,387,775 | B1 | | 5/2002 | Jang et al. | 438/396 |
| 6,426,249 | B1 | | 7/2002 | Geffken et al. | 438/239 |
| 6,638,876 | B2 | * | 10/2003 | Levy et al. | 438/769 |
| 2002/0022331 | A1 | | 2/2002 | Saran | 438/381 |

* cited by examiner

*Primary Examiner*—Phuc T. Dang
(74) *Attorney, Agent, or Firm*—Scully, Scott, Murphy & Presser; Anthony J. Canale, Esq.

(57) ABSTRACT

The present invention provides a high-performance metal-insulator-metal (MIM) capacitor which contains a high-k dielectric, yet no substantial shorting of the MIM capacitor is observed. Specifically, shorting of the MIM capacitor is substantially prevented in the present invention by forming a passivation layer between the high-k dielectric layer and each of the capacitor's electrodes. The inventive MIM capacitor includes a first conductor; a first passivation layer located atop the first conductor; a high-k dielectric layer located atop the first passivation layer; a second passivation layer located atop the high k dielectric layer; and a second conductor located atop the second passivation layer.

18 Claims, 3 Drawing Sheets

PREVENTION OF $TA_2O_5$ MIM CAP SHORTING IN THE BEOL ANNEAL CYCLES

This application claims benefit of U.S. provisional application Ser. No. 60/430,421, filed Dec. 3, 2002.

BACKGROUND OF INVENTION

Field of the Invention

The present invention generally relates to semiconductor devices, and more particularly to a metal-insulator-metal (MIM) capacitor for use in back-end-of-the-line (BEOL) structures.

In the semiconductor industry, high performance capacitors are in great demand since such capacitors are essential for numerous applications, including, for example, RF and microwave. High performance capacitors have greater densities than a conventional capacitor, which leads to a reduction in chip size.

Metal-insulator-metal (MIM) capacitors that are formed above back-end-of-the line (BEOL) metallurgy are also known. A typical MIM capacitor for use in BEOL structures is shown, for example, in FIG. 1. Specifically, FIG. 1 illustrates a prior art MIM capacitor which includes a $SiO_2$ or SiN dielectric layer 12 sandwiched between bottom conductive electrode 10 and top conductive electrode 14. In order to increase the capacitance density of prior art MIM capacitors, there has been a desire to replace the $SiO_2$ or SiN dielectric film with a high dielectric constant film such as $Ta_2O_5$.

However, MIM capacitors containing a high dielectric constant film have the following problems associated therewith: (i) oxygen diffuses readily to the metal-insulator interface through the bottom electrode during deposition of the dielectric film; and (ii) BEOL thermal cycles, such as interlayer dielectric deposition and $H_2$ sintering, lead to increased leakage current and possible shorting of the MIM structure due to the high dielectric constant film reacting with the MIM's conductive electrodes. The aforesaid problems are particularly relevant when $Ta_2O_5$ is used as the high dielectric constant film.

Despite the problems associated with prior art MIM capacitors containing a high dielectric constant film, there is continued interest in developing MIM capacitors which include a high dielectric constant material, such as $Ta_2O_5$ (k~25), yet do not exhibit any of the problems mentioned hereinabove.

SUMMARY OF INVENTION

One object of the present invention is to provide a high performance MIM capacitor for use in BEOL structures.

Another object of the present invention is to provide a MIM capacitor which includes a high dielectric constant, i.e., k, film or layer formed between top and bottom metal electrodes. The term "high dielectric constant"or "high-k" as used throughout the instant application denotes a dielectric film that has a dielectric constant that is greater than about 7.0, preferably greater than about 20.

A further object of the present invention is to provide a MIM capacitor containing a high-k dielectric film in which oxygen diffusion to the metal-insulator interface through the bottom electrode during deposition of the high-k dielectric film is substantially eliminated.

A yet further object of the present invention is to provide a MIM capacitor containing a high-k dielectric film in which leakage current is substantially reduced.

An even further object of the present invention is to provide a MIM capacitor containing a high-k dielectric film in which device shorting is substantially prevented.

These and other objects and advantages are achieved in the present invention by forming a substantially non-reactive passivation layer between the high-k dielectric film and each of the capacitor electrodes. The term "substantially non-reactive" is used herein to denote a dielectric material that is less reactive to the capacitor electrodes as compared to the high-k dielectric film.

The substantially non-reactive passivation layers are capable of stopping the reaction of the high-k dielectric film with the electrodes to prevent shorting. This allows for the use of high-k dielectric films, such as $Ta_2O_5$, as the MIM dielectric to achieve high capacitance density without having to change the current BEOL processing. Changing the BEOL process integration to allow for the use of high-k dielectric films will be complicated, expensive and may result in many incompatibility problems. Using a non-reactive passivation layer provides high-k dielectric MIM capacitors that are compatible with current BEOL processing.

Specifically, the present invention provides a semiconductor structure, i.e., MIM capacitor, which includes a first conductor; a first passivation layer located atop the first conductor; a high-k dielectric layer located atop the first passivation layer; a second passivation layer located atop the high-k dielectric layer; and a second conductor located atop the second passivation layer.

In some embodiments of the present invention, the MIM capacitor of the present invention is located atop a BEOL interconnect wiring structure. In such a structure, the MIM capacitor is typically surrounded by an intra-level or inter-level dielectric layer.

In addition to providing a semiconductor structure, the present invention also provides a method of fabricating the same. Specifically, the method of the present invention includes the steps of: forming a first passivation layer atop a first conductor; forming a high-k dielectric layer atop the first passivation layer;

forming a second passivation layer atop the high-k dielectric layer; and forming a second conductor atop the second passivation layer.

The present invention also provides a method for integrating the inventive high performance MIM capacitor into a BEOL interconnect wiring structure.

BRIEF DESCRIPTION OF DRAWINGS

These and other objects and advantages of the present invention will become apparent from the following detailed description and the appended drawings in which.

DETAILED DESCRIPTION

The present invention, which provides a high performance MIM capacitor containing a high-k dielectric film, will now be described in more detail by referring to the following discussion and FIGS. 2–8.

Figure 1:
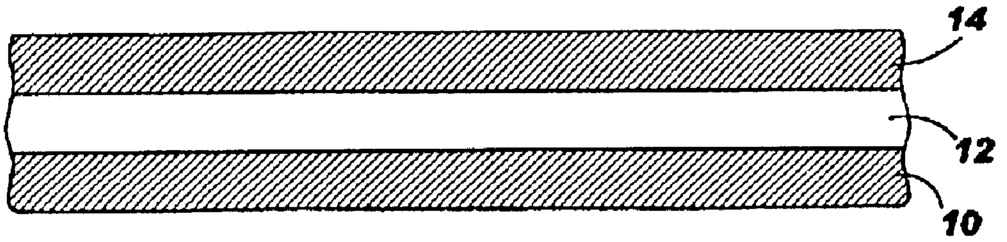
FIG. 1 is a pictorial representation (through a cross sectional view) illustrating a typical prior art MIM capacitor structure.
Figure 2:
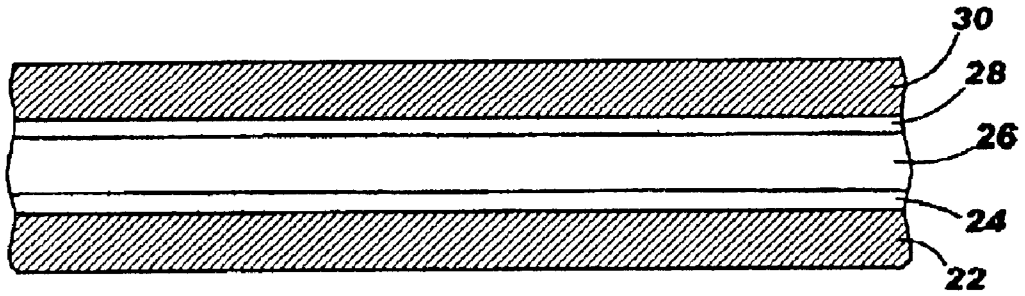
FIG. 2 is a pictorial representation (through a cross sectional view) illustrating a high-k MIM capacitor of the present invention.
Figure 3:
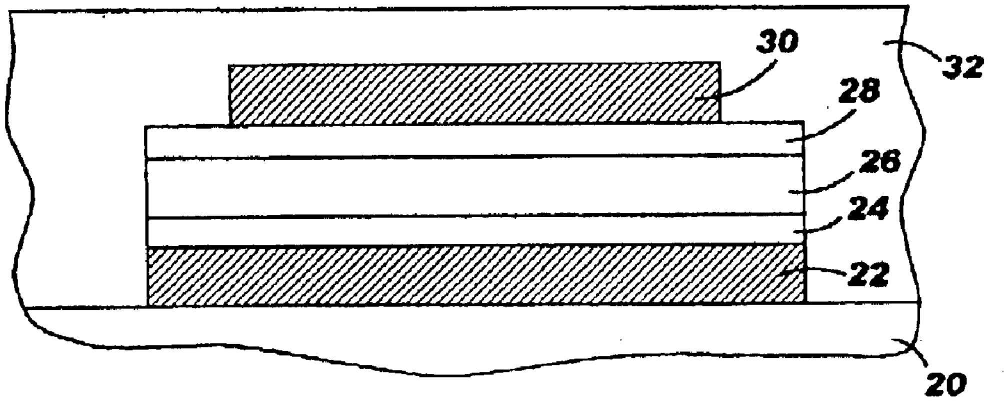
FIG. 3 is a pictorial representation (through a cross sectional view) illustrating the MIM capacitor of FIG. 2 surrounded by an intra-level or inter-level dielectric layer.

Reference is first made to FIG. 2 which is a cross sectional view illustrating the MIM capacitor of the present invention. Specifically, the MIM capacitor shown in FIG. 2 includes a first passivation layer 24 located atop a first conductor 22; a high-k dielectric layer 26 located atop the first passivation layer 24; a second passivation layer 28 located atop the high-k dielectric layer 26; and a second conductor 30 located atop the second passivation layer 28. It should be noted that the MIM capacitor of FIG. 2 is formed atop a BEOL interconnect wiring structure. FIG. 3 is an illustration of a BEOL interconnect structure containing the MIM capacitor of FIG. 2. In FIG. 3, BEOL interconnect wiring structure 20 as well as intra-level or inter-level dielectric layer (ILD) 32 are also shown.

The materials present in the structures shown in FIGS. 2–3 as well as the method of fabricating those structures will now be described in greater detail.

Figure 4:
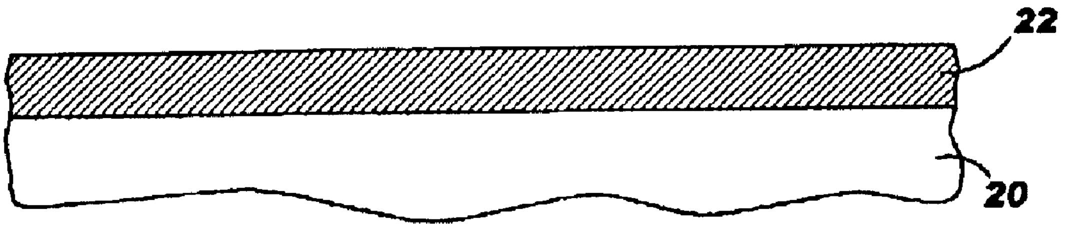
FIGS. 4–8 are pictorial representations (through cross sectional views) illustrating the basic processing steps that are employed in the present invention in fabricating the structures shown in FIGS. 2 and 3.

Reference is first made to FIG. 4 which is a cross-sectional view illustrating an initial structure that is utilized in the present invention. In the initial structure, there is shown a first conductor 22 located atop portions of a BEOL interconnect wiring structure 20. The BEOL interconnect wiring structure 20 includes various insulating layers, which are formed over the surface of a semiconductor substrate.

The various insulating layers may comprise organic low-k dielectric materials as well as inorganic dielectric materials, both of which are well known to those skilled in the art. The insulating layers may include various wiring regions, i.e., metal lines and vias, formed therein. Moreover, the upper surface of the BEOL interconnect wiring structure 20 includes a polished flat ILD surface with buried vias and wiring. The metal lines, vias or contacts of the BEOL wiring structure may be composed of a conductive metal such as Cu, W or Al. A liner such as TiN, Ti, Ta, TaN may optionally be formed between the conductive metal and the insulating layer.

The BEOL interconnect wiring structure 20 is formed utilizing conventional processes that are well known to those skilled in the art including, for example, a single or a dual damascene process or subtractive Al processes.

The first conductor 22 is formed atop the surface of the BEOL interconnect wiring structure 20 utilizing a deposition process including, but not limited to: sputtering, plating, evaporation, chemical vapor deposition (CVD), plasma-enhanced CVD, chemical solution deposition, atomic layer deposition and other like deposition processes. The thickness of the first conductor 22 may vary depending upon the type of conductive material employed as well as the deposition process that is used in forming the same. Typically, the first conductor 22 has a thickness of from about 3000 to about 7000 Å.

The first conductor 22 may be comprised of any conductive metal or metal alloy including, but not limited to: TiN, Ti, TiSiN, TaN, Pt, Ir, Ru, Al, Au, Cu, Ta, TaSiN and mixtures, e.g., alloys, and multilayers thereof. For example, the first conductor 22 may be comprised of a metal stack comprising layers of TiN/Al/TiN. In the TiN/Al/TiN stack, the TiN retards metal diffusion into the Al. TiN does not, however, serve as a passivation layer for the high-k dielectric since it will not prevent breakdown of the high-k dielectric. Preferably, the first conductor 22 is selected from the group consisting of TiN/Al/TiN, Al, Al alloys, Cu and Cu alloys. The first conductor 22 is used in the present invention as the bottom electrode of the MIM capacitor. It is also noted that in some embodiments, the first conductor may also serve as both the bottom electrode of the MIM capacitor as well as the metal contact for the BEOL interconnect wiring structure.

Figure 5:
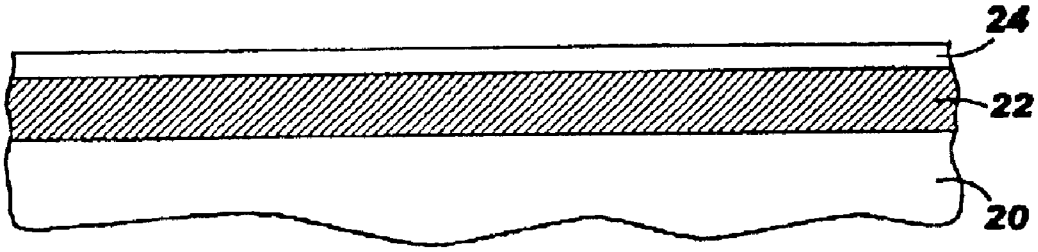

After forming the first conductor 22 atop a surface of the BEOL interconnect wiring structure 20, a first passivation layer 24 is formed atop the surface of the first conductor 22 providing the structure shown, for example, in FIG. 5. The first passivation layer 24 is formed utilizing a deposition process including, but not limited to: evaporation, chemical vapor deposition (CVD), plasma-assisted CVD, chemical solution deposition, atomic layer deposition and other like deposition processes. The thickness of first passivation layer 24 may vary depending on the material used for passivation as well as the method that is employed in forming the same. Typically, the first passivation layer 24 has a thickness of from about 10 to about 500 Å, with a thickness of from about 10 to about 100 Å being more highly preferred.

The first passivation layer 24 is composed of a substantially non-reactive dielectric material, as compared to the high-k dielectric film 26, which is capable of preventing the high-k dielectric film from interacting under subsequent thermal treatments, with the underlying first conductor 22. Illustrative examples of substantially non-reactive dielectric materials that are employed as the first passivation layer 24 include, but are not limited to: $Al_2O_3$, SiN, $HfO_2$, $ZrO_2$, $SiO_xN_y$, $HfSiO_x$, $SiO_2$ and multilayers thereof.

Figure 6:
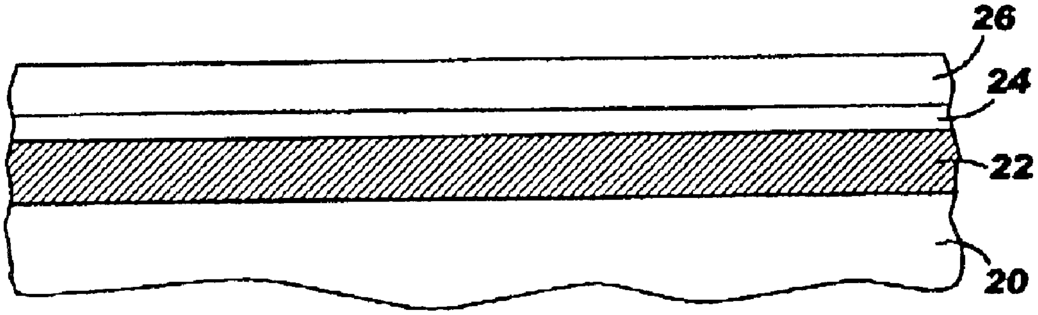
Figure 7:
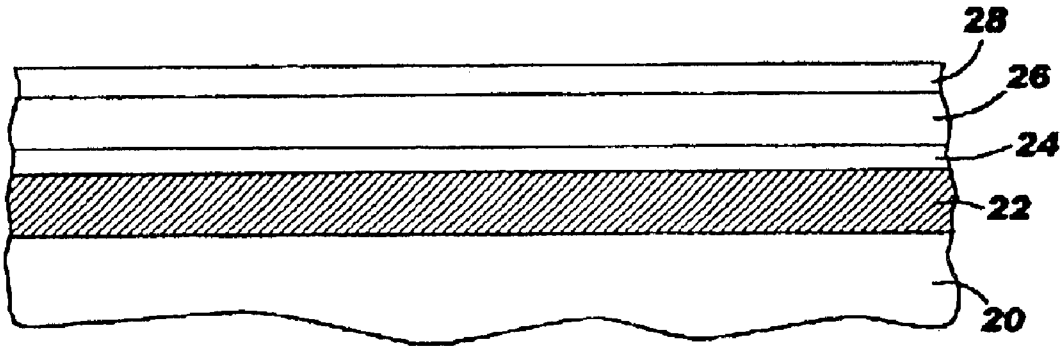

Next, as is shown in FIG. 6, a high-k dielectric film or layer 26 is formed atop the first passivation layer 24. The high-k dielectric film 26 is formed utilizing a deposition process including, but not limited to: evaporation, CVD, plasma-enhanced CVD, chemical solution deposition, atomic layer deposition and other like deposition processes. The thickness of the high-k dielectric film 26 of the MIM capacitor of the present invention may vary depending on the process used in forming the same as well as the material in which the high-k dielectric film 26 is composed. Typically, the high-k dielectric film 26 has a thickness of from about 100 to about 1000 Å, with a thickness of from about 100 to about 500 Å being more highly preferred. It is noted that the terms "film" and "layer" are interchangeably used throughout the present application when discussing the high-k dielectric 26.

As stated above, the term "high-k dielectric" denotes a dielectric material that has a dielectric constant, as measured in a vacuum, that is greater than about 7.0, preferably greater than about 20. The high-k dielectric film 26 is composed of a dielectric material that is highly reactive with the first conductor 22 and second conductor 30. Illustrative examples of high-k dielectrics that are employed in the present invention include, but are not limited to: $Ta_2O_5$, $ZrO_2$, $HfO_2$, bismuth doped $Ta_2)_5$, perovoskite type oxides (crystalline and amorphous) and other like high-k dielectric films. It is noted that high-k dielectric film used in the present invention is more reactive to the conductors than are the passivation layers. Thus, although $ZrO_2$ is listed as a possible choice for both the high-k dielectric film and the passivation layers, the use of a passivation layer comprising solely $ZrO_2$ and a high-k dielectric film comprising solely $ZrO_2$ is excluded from the present invention.

As stated above, the term "high-k dielectric" denotes a dielectric material that has a dielectric constant, as measured in a vacuum that is greater than about 7.0, preferably greater than about 20. The high-k dielectric film 26 is composed of a dielectric material that is highly reactive with the first conductor 22 and second conductor 30. illustrative examples of high-k dielectrics that are employed in the present invention include, but are not limited to: $Ta_2O_5$, $ZrO_2$, $HfO_2$, bismuth doped $Ta_2O_5$, perovskite-type oxides (crystalline and amorphous) and other like high-k dielectric films. It is noted that high-k dielectric film used in the present invention is more reactive to the conductors than are the passivation layers. Thus, although $ZrO_2$ is listed as a possible choice for both the high-k dielectric film and the passivation layers, the use of a passivation layer comprising solely $ZrO_2$ and a high-k dielectric film comprising solely $ZrO_2$ is excluded from the present invention.

The term "perovskite-type oxide" is used in the present invention to denote a material which includes at least one acidic oxide containing at least one metal selected from Group IVB (Ti, Zr or Hf), VB (V, Nb or Ta), VIB (Cr, Mo or W), VIIB (Mn or Re) or IB (Cu, Ag or Au) of the Periodic Table of Elements (CAS version) and at least one additional cation having a positive formal charge of from about 1 to about 3. Such perovskite-type oxides typically have the basic formula: $ABO_3$ wherein A is one of the above mentioned cations, and B is one of the above mentioned metals.

It is emphasized that the perovskite-type oxide employed in the present invention is preferred to be in an amorphous (or low temperature) phase since the crystalline phase of such materials is produced at temperatures which may not be compatible with BEOL processing. The term "amorphous phase" is used herein to denote that the crystal structure of the perovskite-type oxide lacks order. This is different from the crystalline phase of the material wherein a highly ordered crystal structure is observed.

Of the various high-k dielectric films mentioned above, it is preferred that the high-k dielectric film 26 is selected from the group consisting of $Ta_2O_5$, $ZrO_2$ and $HfO_2$. In a highly preferred embodiment of the present invention, the high-k dielectric film 26 is comprised of $Ta_2O_5$.

After forming the high-k dielectric layer 26, a second passivation layer 28 is formed atop the high-k dielectric layer 26. The resultant structure that is formed after the second passivation layer 28 has been formed atop the high-k dielectric layer 26 is shown, for example, in FIG. 7. The second passivation layer 28 may be formed utilizing one of the processes mentioned above in regard to the first passivation layer 24. The thickness of the second passivation layer 28 may vary, but typically, second passivation layer 28 has a thickness of from about 10 to about 500 Å, with a thickness of from about 10 to about 100 Å being more highly preferred.

The second passivation layer 28 may be composed of the same or different dielectric material as the first passivation layer 24. Thus, it is possible in the present invention to have the first and second passivation layers be composed of the same dielectric material, or the first passivation layer may be composed of one dielectric material, while the second passivation layer is composed of another dielectric material. Preferred materials for the second passivation layer 28 include $Al_2O_3$, SiN, $HfO_2$, $SiO_xN_y$, $HfSiO_x$, $ZrO_2$ and $SiO_2$. Multilayers are also contemplated.

Figure 8:
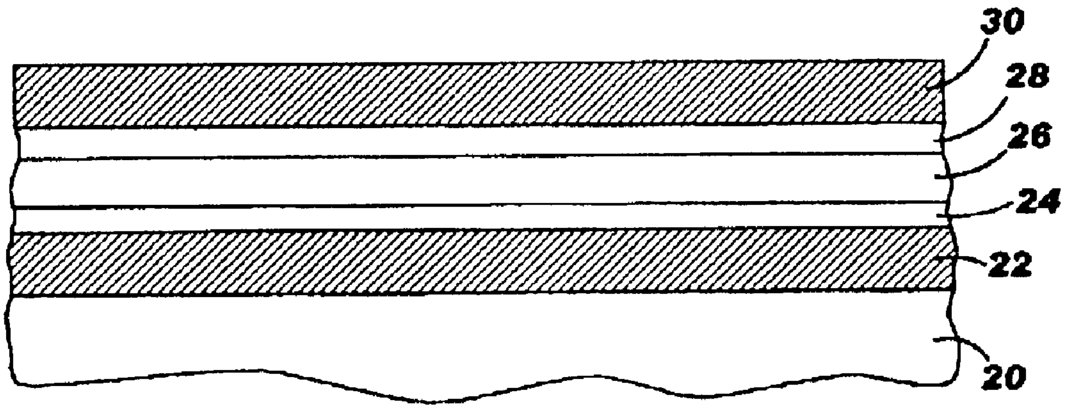

After forming the second passivation layer 28 atop the high-k dielectric layer 26, a second conductor 30 is then formed atop the second passivation layer 28 providing the structure shown, for example, in FIG. 8. The second conductor 30 is formed utilizing one of the methods mentioned above in regard to forming the first conductor 22. Moreover, the second conductor has a thickness which is in the ranges recited above for the first conductor 22. Second conductor 30 may be composed of the same or different conductive material as the first conductor 22. Thus, it is possible in the present invention to have the first and second conductors be composed of the same conductive material, or the first conductor may be composed of one conductive material, while the second conductor is composed of another conductive material. Illustrative examples of preferred conductive materials for second conductor 30 include TiN/Al/TiN, Al, Al alloys, Cu and Cu alloys. In one highly preferred embodiment of the present invention, the first and second conductors are both composed of a conductive metal stack of TiN/Al/TiN. It is emphasized that the TiN layer of the TiN/Al/TiN metal stack is not a passivation layer since it will not prevent breakdown of the high-k dielectric. The second conductor 30 is the top electrode of the MIM capacitor of the present invention.

At this point of the present invention, or immediately following the formation of one of the MIM capacitor's material layers, i.e., layers 22, 24, 26, 28 and 30, the MIM capacitor's material layers may be patterned. Patterning of the material layers of the MIM capacitor is achieved by lithohgraphy and etching. The lithography step includes applying a photoresist to the material layer to be patterned, exposing the photoresist to a desired pattern of radiation and developing the pattern into the photoresist utilizing a conventional resist developer. Following patterning of the photoresist, the desired pattern is transferred to the material layer utilizing the above mentioned etching step. The etching step includes a dry etching process, a wet etching process or any combination thereof. When dry etching is performed, reactive-ion etching, plasma etching, ion beam etching or laser ablation may be used. When a wet etch process is employed, a chemical etchant that is highly selective in removing the desired material layer is used.

For the sake of clarity, the drawings up to this point of the present invention do not show any patterning of the MIM capacitor's material layers. It is, however, possible to have a MIM capacitor wherein patterning of the material layers is achieved. For example, it is possible to provide a MIM capacitor in which the outer edges of the high-k dielectric layer 26, the first and second passivation layers 24 and 28 do not extend beyond the outer edges of the first conductor 22, but layers 24, 26 and 28 may extend beyond the edges of the second conductor 30. FIG. 3 shows a structure after patterning the MIM capacitor of FIG. 8.

During the course of fabricating the MIM capacitor of the present invention, or subsequent to its fabrication, the structure may be subjected to one or more BEOL annealing steps. The one or more BEOL annealing steps are well known to those skilled in the art. Included in these one or more BEOL annealing steps are deposition of the ILD and $H_2$ sintering. The one or more anneals are typically performed at a temperature of about 300° C. or greater in various types of ambients that are well known to those skilled in the art.

An inter-layer or intra-layer dielectric 32 (hereinafter referred to as the "ILD layer") is formed about the patterned MIM capacitor structure shown in FIG. 8 providing the structure shown, for example, in FIG. 3. The ILD layer 32 is composed of a conventional organic or inorganic dielectric material. A multilayer ILD is also contemplated herein. The ILD is formed utilizing a conventional deposition process including, for example, spin-on coating, CVD, plasma-assisted, evaporation, chemical solution deposition and other like deposition processes. Following deposition, one or more barrier layers, etch-stop layers, or polish stop layers may be formed atop the ILD dielectric. The thickness of the ILD layer 32 may vary and is not critical to the basic understanding of the present invention.

The MIM capacitors of the present invention are high performance capacitors which have a capacitance density on the order of about 2 fF/$\mu m^2$ or greater and a current density on the order of about $1\times10^{-8}$ A/$cm^2$ or lower. More preferably, the MIM capacitors of the present invention have a capacitance on the order of about 4 fF/$\mu m^2$ or greater and a current density on the order of about $1\times10^{-7}$ A/$cm^2$ or lower. The use of such passivation films also leads to higher breakdown voltages and better reliability for the MIM capacitor as compared to capacitors based on single $Ta_2O_5$ layers as dielectric films. Furthermore, the total physical thickness of the passivation layers is typically greater that 350 Å, which provides a good etch process window. Moreover, the MIM capacitors of the present invention containing the passivation layers are more resistant to surface roughness and hillocks, i.e., bumps, in the conductors 22 and 30 than a typical prior art MIM capacitor. All of the above provides an improved single mask process and also improved device parametrics along with capacitance densities greater than 4 fF/$\mu m^2$. In order to achieve greater than 4 fF/$\mu m^2$ for the prior art MIMs using SiN or SiO2, thin films less than 200 Å are needed which reduce etch process window (lower MIM reliability) or require a second mask (additional cost).

The following example is provided to illustrate the advantages of the MIM capacitor of the present invention over a prior art MIM capacitor.

EXAMPLE

In this example, a MIM capacitor of the present invention which contains passivation between a 190 Å $Ta_2O_5$ dielectric and bottom and top electrodes, e.g., a metal stack of TiN/Al/TiN, was prepared and the electrical properties, i.e., capacitance and current density were compared to a prior art MIM capacitor which contains no passivation between the top and bottom electrodes. In the prior art MIM capacitor, the top and bottom electrodes are both composed of a metal stack of TiN/Al /TiN. It is noted that the TiN portion of the electrode does not serve as a passivation layer. Rather, the TiN is part of the electrode.

The results of this example are shown in the table which follows. Specifically, the following is observed: The leakage current after annealing is ~7–8 orders of magnitude lower with the alumina, i.e., $Al_2O_3$, passivation. Moreover, the capacitance density of the MIM capacitor based on the present invention may be improved by reducing the thickness of the passivation layers. Hence, the present invention MIM capacitor does not short out in the BEOL heating cycles, which is a principal objective of the present invention. Note that the TiN layer of the prior art MIM capacitor does not prevent breakdown of the high-k dielectric.

| Sample | Dielectric Film (Å) | Passivation | Capacitance (fF/$\mu m^2$) | J at 5 V (A/$cm^2$) Pre-Anneal | J at 5 V (A/$cm^2$) Post-Anneal |
|---|---|---|---|---|---|
| Comparative | 500 Å $Ta_2O_5$ | None | 4 | $5 \times 10^{-6}$ | $5 \times 10^{-1}$ |
| Invention | 190 Å $Ta_2O_5$ | 45Å Alumina | 4.56 | $3.1 \times 10^{-8}$ | $2.2 \times 10^{-8}$ |

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A semiconductor structure comprising:

a first conductor located on a surface of a back-end-of-the-line (BEOL) interconnect wiring structure;

a first passivation layer located atop the first conductor;

a high-k dielectric layer located atop the first passivation layer;

a second passivation layer located atop the high-k dielectric layer; and a second conductor located atop the second passivation layer.

2. The semiconductor structure of claim 1 wherein the first and second conductors comprise a bottom and top plate of a capacitor, respectively.

3. The semiconductor structure of claim 1 wherein the first and second conductors comprise a metal, metal alloy or multilayers thereof.

4. The semiconductor structure of claim 3 wherein the first and second conductors are selected from the group consisting of TiN, TiSiN, Ti, TaN, Pt, Ir, Ru, Al, Au, Cu, Ta, TaSiN and mixtures or multilayers thereof.

5. The semiconductor structure of claim 4 wherein the first and second conductors are selected from the group consisting of a stack of TiN/Al/TiN, Al, Al alloys, Cu and Cu alloys.

6. The semiconductor structure of claim 1 wherein the first and second conductors are both comprised of TiN/Al/TiN.

7. The semiconductor structure of claim 1 wherein the first and second passivation layers are selected from the group consisting of $Al_2O_3$, SIN, $HfO_2$, $SiO_xN_y$, $HfSiO_x$, $ZrO_2$ and $SiO_2$.

8. The semiconductor structure of claim 1 wherein the first and second passivation layers have a thickness of about 10 Å to about 500 Å.

9. The semiconductor structure of claim 1 wherein the high-k dielectric layer has a dielectric constant of greater than about 7.0.

10. The semiconductor structure of claim 1 wherein the high-k dielectric layer is selected from the group consisting of $Ta_2O_5$, $ZrO_2$, bismuth doped $Ta_2O_5$, $HfO_2$ and a perovskite-type oxide.

11. The semiconductor structure of claim 1 wherein the high-k dielectric layer is $Ta_2O_5$.

12. The semiconductor structure of claim 1 further comprising an inter-level or intra-level dielectric surrounding said structure.

13. A semiconductor structure comprising:

a first conductor located on a surface of a back-end-of-the-line (BEOL) interconnect wiring structure;

a first passivation layer located atop the first conductor;

$Ta_2O_5$ located atop the first passivation layer;

a second passivation layer located atop the $Ta_2O_5$; and a second conductor located atop the second passivation layer.

14. The semiconductor structure of claim 13 wherein said first and second conductors are comprised of TiN/Al/TiN.

15. The semiconductor structure of claim 13 wherein said first and second passivation are comprised of $Al_2O_3$.

16. A method for forming a semiconductor structure comprising:

forming a first passivation layer atop a first conductor, said first conductor is located on a surface of a back-end-of-the-line (BEOL) interconnect wiring structure;

forming a high-k dielectric layer atop the first passivation layer;

forming a second passivation layer atop the high-k dielectric layer; and forming a second conductor atop the second passivation layer.

17. The method of claim 16 further comprising patterning the semiconductor structure by lithography and etching.

18. The method of claim 16 further comprising forming an inter-layer or intra-layer dielectric about the structure.

* * * * *

UNITED STATES PATENT AND TRADEMARK OFFICE

CERTIFICATE OF CORRECTION

PATENT NO. : 6,940,117 B2 Page 1 of 1
DATED : September 6, 2005
INVENTOR(S) : Douglas D. Coolbaugh et al.

It is certified that error appears in the above-identified patent and that said Letters Patent is hereby corrected as shown below:

Column 10,
Lines 11-14, insert the following claims:

21. The semiconductor structure of Claim 1 wherein the high-k dielectric Layer has a thickness of about 100 Å to about 1000 Å.

22. The semiconductor structure of Claim 14 wherein the first and second passivation layers have a thickness of about 10 Å to about 500 Å, and the $Ta_2O_5$ has a thickness of about 100 Å to about 1000 Å.

Signed and Sealed this

Thirtieth Day of May, 2006

JON W. DUDAS
*Director of the United States Patent and Trademark Office*